United States Patent
Chou et al.

(10) Patent No.: US 7,465,654 B2
(45) Date of Patent: Dec. 16, 2008

(54) STRUCTURE OF GOLD BUMPS AND GOLD CONDUCTORS ON ONE IC DIE AND METHODS OF MANUFACTURING THE STRUCTURES

(75) Inventors: Chiu-Ming Chou, Kao-hsiung (TW); Mou-Shiung Lin, Hsinchu (TW)

(73) Assignee: Megica Corporation, Hsin-chu (TW)

( * ) Notice: Subject to any disclaimer, the term of this patent is extended or adjusted under 35 U.S.C. 154(b) by 381 days.

(21) Appl. No.: 11/178,541

(22) Filed: Jul. 11, 2005

(65) Prior Publication Data
US 2006/0019490 A1    Jan. 26, 2006

Related U.S. Application Data

(60) Provisional application No. 60/586,840, filed on Jul. 9, 2004.

(30) Foreign Application Priority Data
Aug. 12, 2004  (TW) ............................... 93124492 A
Dec. 10, 2004  (TW) ............................... 93138329 A

(51) Int. Cl.
*H01L 21/44* (2006.01)
*H01L 21/00* (2006.01)
(52) U.S. Cl. .................. 438/614; 438/597; 438/612; 438/613; 257/E21.476; 257/E21.479

(58) Field of Classification Search ................ 438/614, 438/669, 671, 597, 612, 613; 257/E21.476, 257/E21.479
See application file for complete search history.

(56) References Cited

U.S. PATENT DOCUMENTS

| | | | | |
|---|---|---|---|---|
| 6,362,087 B1 * | 3/2002 | Wang et al. | ................. | 438/597 |
| 6,642,136 B1 * | 11/2003 | Lee et al. | ................. | 438/613 |
| 6,841,872 B1 * | 1/2005 | Ha et al. | ................. | 257/736 |
| 6,959,856 B2 * | 11/2005 | Oh et al. | ................. | 228/245 |
| 7,078,331 B2 * | 7/2006 | Kwon et al. | ................. | 438/612 |
| 2003/0127734 A1 * | 7/2003 | Lee et al. | ................. | 257/737 |

* cited by examiner

*Primary Examiner*—Walter L Lindsay, Jr.
*Assistant Examiner*—Angel Roman
(74) *Attorney, Agent, or Firm*—Saile Ackerman LLC; Stephen B. Ackerman; Rosemary L. S. Pike

(57) ABSTRACT

A method for fabricating multiple metal layers includes the following steps. An electronic component is provided with multiple contact points. A first metal layer is deposited over said electronic component. A first mask layer is deposited over said first metal layer. A second metal layer is deposited over said first metal layer exposed by an opening in said first mask layer. Said first mask layer is removed. A second mask layer is deposited over said second metal layer. A third metal layer is deposited over said second metal layer exposed by an opening in said second mask layer. Said second mask layer is removed. Said first metal layer not covered by said second metal layer is removed.

20 Claims, 8 Drawing Sheets

STRUCTURE OF GOLD BUMPS AND GOLD CONDUCTORS ON ONE IC DIE AND METHODS OF MANUFACTURING THE STRUCTURES

This application claims priority to U.S. Provisional Patent Application Ser. No. 60/586,840, filed on Jul. 9, 2004, which is herein incorporated by reference in its entirety.

RELATED PATENT APPLICATION

This application is related to Ser. No. 11/178,753, filed on Jul. 11, 2005, now pending, assigned to a common assignee, which is herein incorporated by reference in its entirety.

BACKGROUND OF THE INVENTION

1. Field of the Invention

This invention relates to structures and methods of manufacture and assembly of integrated circuit chips. More particularly, this invention relates to forming structures of bumps and circuit lines on the same IC die.

2. Description of the Related Art

Gold bumps have been widely used for TAB (Tape-Automated-Bonding) assembly. Recently LCD (Liquid Crystal Display) panels have become mainstream for display technology. Gold bumps are created on the LCD driver IC (integrated circuit) dies and used for Tape-Carrier-Package (TCP), Chip-on-Film (COF), or Chip-on-Glass (COG) assembly.

U.S. Pat. No. 6,653,235 to Liang et al describes methods of forming Ni/Cu or Ni/Au bumps by electroplating and also forming a metal redistribution layer that is preferably copper.

SUMMARY OF THE INVENTION

An object of this invention is to provide a structure of gold bumps and gold conductors on an IC chip.

Another object of this invention is to provide a method for forming a structure of gold bumps and gold conductors on an IC chip.

A further object is to provide structures of gold metals having different thicknesses on an IC.

A still further object is to provide a method of forming structures of gold metals having different thicknesses on an IC.

In accordance with the objects of the invention, an integrated circuit chip having gold metal structures of different thicknesses is achieved. The integrated circuit chip comprises a substrate having semiconductor devices and interconnection lines formed thereover. A passivation layer overlies the substrate. Gold metal structures overlie the passivation layer wherein a first subset of the gold metal structures has a first thickness and a second subset of the gold metal structures has a second thickness greater than the first thickness.

Also in accordance with the objects of the invention, a method of fabricating gold metal structures on an integrated circuit is achieved. An integrated circuit chip is provided covered by a passivation layer wherein openings are formed through the passivation layer to underlying contact pads. An adhesion/barrier layer is sputtered overlying the passivation layer and the contact pads. A seed layer is sputtered or electroplated overlying the adhesion/barrier layer. A first mask is formed on the seed layer, wherein multiple openings in the first mask expose the seed layer. A first gold layer having a first thickness is electroplated on the seed layer exposed through the openings in the first mask. Thereafter, a second mask is formed on the seed layer or on the gold layer, wherein multiple openings in the second mask expose the seed layer or the first gold layer. A second gold layer having a second thickness is electroplated on the seed layer or the first gold layer exposed through the openings in the second mask. Thereafter, the seed layer and adhesion/barrier layer not covered by the first gold layer are removed.

DETAILED DESCRIPTION OF THE INVENTION

Figure 1:
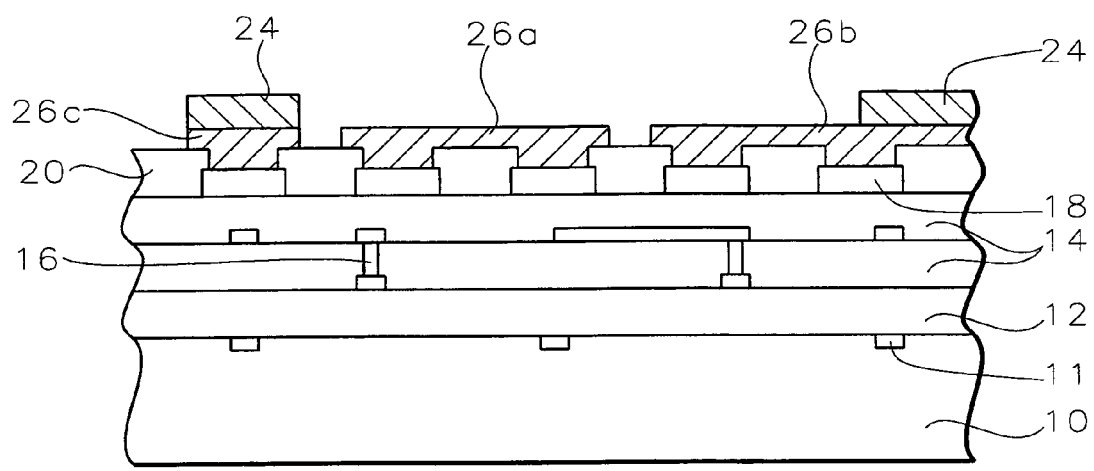
FIGS. 1 through 4 are cross-sectional views of completed gold structures of the present invention.

In the present invention, it is desired to create a new structure of gold circuits on LCD driver IC dies in addition to gold bumps. The gold circuits may be thinner than the gold bumps and may be used for interconnection between two circuits on the die, redistribution of the original I/O pads, power/ground planes or buses, or an electrical connection only for an external circuitry component bonded to the die.

In the present invention, gold metal structures of different thicknesses are fabricated using cost-effective methods of manufacture. This method is especially valuable to the concurrent LCD driver IC's in that it provides gold bumps and gold interconnect or RDL (redistribution layer) on one die. Gold bumps are typically thicker than gold circuits used for interconnection or RDL.

FIGS. 1 through 4 illustrate various combinations of thick and thin gold metal structures of the invention. It will be understood that the invention is not limited to those structures so illustrated, but is equally applicable to any desired combinations of structures.

Semiconductor substrate 10 is shown in FIGS. 1-4. Transistors and other devices, such as MOS or passive devices, are formed in and on the semiconductor substrate 10. These are represented by devices 11 in the figures. Dielectric layer 12 comprising silicon oxide or silicon nitride is formed over the substrate 10. Metal interconnections 16 and 18 and intermetal dielectric layers 14 are formed over the dielectric layer 12. The metal interconnections 16 may comprise aluminum, an aluminum-copper alloy, or an aluminum-silicon alloy deposited by a sputter process or they may comprise copper deposited by an electroplating process. The intermetal dielectric layers 14 may comprise silicon oxide. We refer to the interconnections 16 and 18 as the fine line metal interconnection thinner than 1 μm. Overlying these layers 14 are the topmost fine line metal layer 18 comprising contact pads that are connected to devices 11, and are in some instances to be connected to surrounding circuitry. Passivation layer 20 is formed over the topmost dielectric layer 14. Multiple openings in the passivation layer 20 exposes the contact pads. The passivation layer 20 have a thickness, preferably, thicker than about 0.3 um. The passivation layer 20 is composed of a silicon-oxide layer, a silicon-nitride layer, a phosphosilicate glass (PSG) layer, or a composite structure comprising the above-mentioned layers. The passivation layer 20 comprises one or more insulating layers, such as silicon-nitride layer or silicon-oxide layer, formed by CVD processes. For example, a silicon-nitride layer with a thickness of between 0.2 and 1.2 μm is formed over a silicon-oxide layer with a thickness of between 0.1 and 0.8 μm. Generally, the passivation layer 20 comprises a topmost silicon-nitride layer or a topmost silicon-oxide layer in the finished chip structure. The passivation layer 20 comprises a topmost CVD insulating layer in the finished chip structure. The passivation layer prevents the penetration of mobile ions, such as sodium ions, moisture, transition metals, such as gold, silver, copper, and so on, and other contaminations. The passivation layer is used to protect the underlying devices, such as transistors, polysilicon resistors, poly-to-poly capacitors, and fine-line metal interconnections.

In one embodiment of the invention, FIG. 1 illustrates an interconnection circuit 26 deposited on the passivation layer 20, and bumps 24 formed on the interconnection circuits 26b and 26c. The interconnection circuits 26a and 26b are used to make connections between multiple portions of the fine line metal layer 18 under the passivation layer 20 and to transmit a signal, such as an address signal, a data signal, a clock signal, a logic signal or an analog signal, from one portion of the fine line metal layer to at least one other portion. The interconnection circuit 26a is not connected to an external circuitry component through bumps. The interconnection circuit 26b may be connected to an external circuitry component through bumps 24.

In the case as shown in FIG. 1, the interconnection circuits 26a, 26b and 26c may comprise a topmost metal layer with a thickness of between 2 μm and 30 μm and with greater than 90 weight percent gold, and, preferably, greater than 97 weight percent gold, and the bumps 24 may comprise a topmost metal layer with a thickness of between 7 μm and 30 μm and with greater than 90 weight percent gold, and, preferably, greater than 97 weight percent gold.

Figure 2:
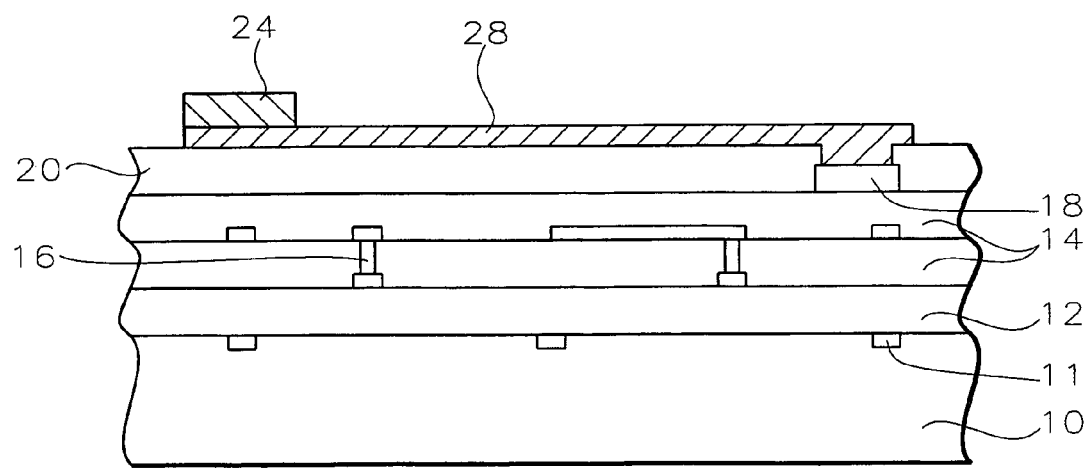

In another embodiment of the invention, FIG. 2 shows a bump 24 and a redistribution line (RDL) 28, wherein the bump 24 is formed on the RDL 28. The RDL 28 is formed on the passivation layer 20 and connects an original contact pad of the fine line metal layer 18 to the bump 24. The positions of the original contact pad and the bump 24 from a top view are different. The RDL 28 may be used to transmit signals or to be connected to a power or ground reference.

In the case as shown in FIG. 2, the RDL 28 may comprise a topmost metal layer with a thickness of between 2 μm and 30 μm and with greater than 90 weight percent gold, and, preferably, greater than 97 weight percent gold, and the bump 24 may comprise a topmost metal layer with a thickness of between 7 μm and 30 μm and with greater than 90 weight percent gold, and, preferably, greater than 97 weight percent gold.

Figure 3:
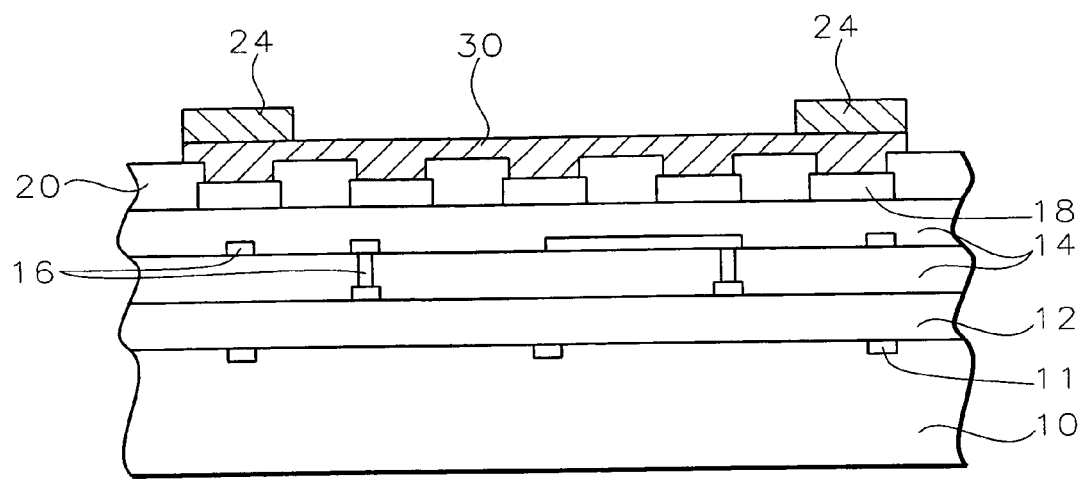

In yet another embodiment of the invention, FIG. 3 illustrates a power plane or bus or ground plane or bus 30 and bumps 24, wherein the bumps 24 are deposited on the power plane or bus or ground plane or bus 30. The power plane or bus or ground plane or bus 30 is connected to multiple contact pads of the topmost fine line metal layer 18 to distribute the power voltage, or ground, to as many points as needed in the IC die. The power plane or bus or ground plane or bus 30 can be connected to a power plane or bus or ground plane or bus under the passivation layer 20 and/or can be connected to a power plane or bus or ground plane or bus in an external circuitry component through the bumps 24.

In the case as shown in FIG. 3, the power plane or bus or ground plane or bus 30 may comprise a topmost metal layer with a thickness of between 2 μm and 30 μm and with greater than 90 weight percent gold, and, preferably, greater than 97 weight percent gold, and the bumps 24 may comprise a topmost metal layer with a thickness of between 7 μm and 30 μm and with greater than 90 weight percent gold, and, preferably, greater than 97 weight percent gold.

Figure 4:
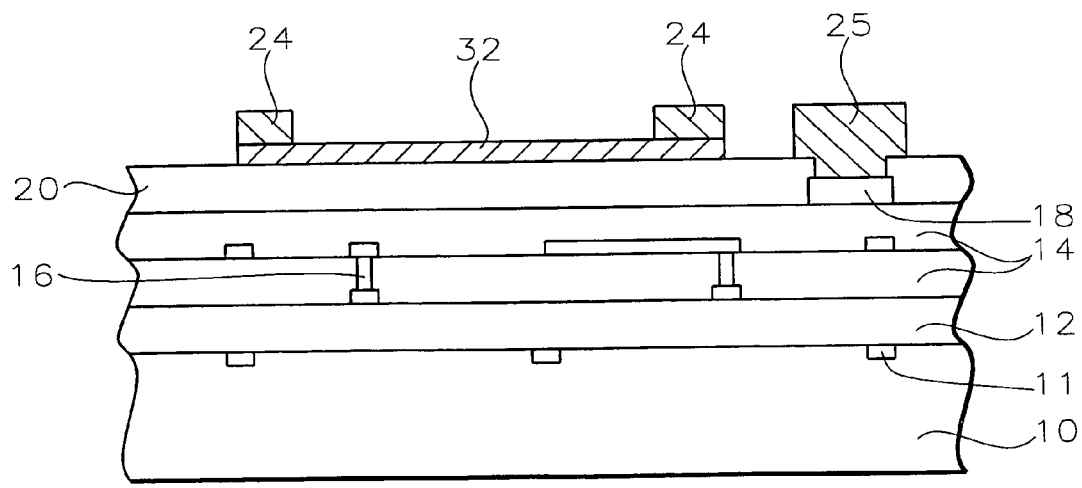

In another embodiment of the invention, FIG. 4 shows bump 24 and 25 and an electrical jump 32 that is an interconnection, a power plane or bus, or a ground plane or bus only for an external circuitry component, such as a glass circuitry substrate. The bumps 24 are formed on the electrical jump 32. The electrical jump 32 formed on the passivation layer 20 is disconnected to the fine line metal layers 18 and 16 under the passivation layer 20, but can be connected to an external circuitry component, such as a glass circuitry substrate, via the bumps 24. A signal, such as an address signal, a data signal, a clock signal, a logic signal or an analog signal, can be transmitted from an end of the external circuitry component to the other end of the external circuitry component through the electrical jump 32. Alternatively, the electrical jump 32 can be a power plane or bus providing a power reference for the external circuitry component via the bumps 24. Alternatively, the electrical jump 32 can be a ground plane or bus providing a ground reference for the external circuitry component via the bumps 24.

In the case as shown in FIG. 4, the electrical jump 32 may comprise a topmost metal layer with a thickness of between 2 μm and 30 μm and with greater than 90 weight percent gold, and, preferably, greater than 97 weight percent gold, and the bumps 24 may comprise a topmost metal layer with a thickness of between 7 μm and 30 μm and with greater than 90 weight percent gold, and, preferably, greater than 97 weight percent gold. The bump 25 may be formed by sputtering a titanium-tungsten alloy, functioning as a adhesion/barrier layer, on a contact pad of the topmost fine line metal layer 18, and then electroplating a bulk metal layer with a thickness of greater than 5 μm, and preferably between 7 μm and 100 μm, on the adhesion/barrier layer, wherein the bulk metal layer may comprise gold with greater than 90 weight percent, and, preferably, greater than 97 weight percent.

The metal circuit layers 26a, 26b, 26c, 28, 30 and 32 as shown In FIGS. 1-4 may not be limited to the above description. The above-mentioned metal circuit layers 26a, 26b, 26c, 28, 30 and 32 may be composed of an adhesion/barrier layer and a bulk metal layer, for example. The adhesion/barrier layer is formed over and in touch with the above-mentioned passivation layer 20. The bulk metal layer is formed over the adhesion/barrier layer. The adhesion/barrier layer may comprise titanium, a titanium-tungsten alloy, titanium nitride, tantalum or tantalum nitride, for example. The bulk metal layer may comprise gold, for example. The bulk metal layer may have a thickness thicker than 1 μm, and preferably between 2 μm and 30 μm, wherein the bulk metal layer may comprise gold with greater than 90 weight percent, and, preferably, greater than 97 weight percent. Alternatively, a seed layer, such as gold, can be sputtered on the adhesion/barrier layer, and then the bulk metal layer is electroplated on the seed layer.

In another case, the above-mentioned metal circuit layers 26a, 26b, 26c, 28, 30 and 32 may be composed of an adhesion/barrier layer and a bulk metal layer, for example. The adhesion/barrier layer is formed over and in touch with the above-mentioned passivation layer 20. The bulk metal layer is formed over the adhesion/barrier layer. The adhesion/barrier layer may comprise titanium, a titanium-tungsten alloy, titanium nitride, tantalum or tantalum nitride, for example. Alternatively, the adhesion/barrier layer may be formed by depositing a chromium layer and then depositing a chromium-copper layer on the chromium layer. The bulk metal layer may have a thickness thicker than 1 μm, and preferably between 2 μm and 30 μm, wherein the bulk metal layer may comprise copper with greater than 90 weight percent, and, preferably, greater than 97 weight percent. Alternatively, a seed layer, such as copper, can be sputtered on the adhesion/barrier layer, and then the bulk metal layer is electroplated on the seed layer.

In another case, the above-mentioned metal circuit layers 26a, 26b, 26c, 28, 30 and 32 may be composed of an adhesion/barrier layer, a first metal layer and a second metal layer, for example. The adhesion/barrier layer is formed over and in touch with the above-mentioned passivation layer 20. The first metal layer is formed over the adhesion/barrier layer, and the second metal layer is formed over the first metal layer. The adhesion/barrier layer may comprise titanium, a titanium-tungsten alloy, titanium nitride, tantalum or tantalum nitride, for example. Alternatively, the adhesion/barrier layer may be formed by depositing a chromium layer and then depositing a chromium-copper layer on the chromium layer. The first metal layer may have a thickness thicker than 1 μm, and preferably between 2 μm and 30 μm, wherein the first metal layer may comprise copper with greater than 90 weight percent, and, preferably, greater than 97 weight percent. The second metal layer comprises nickel, for example, and has a thickness thicker than 1 μm, and preferably between 2 μm and 5 μm. Alternatively, a seed layer, such as copper, can be sputtered on the adhesion/barrier layer, then the first metal layer is electroplated on the seed layer, and then the second metal layer is electroplated on the first metal layer.

In another case, the above-mentioned metal circuit layers 26a, 26b, 26c, 28, 30 and 32 are composed of an adhesion/barrier layer, a first metal layer, a second metal layer and a third metal layer, for example. The adhesion/barrier layer is formed over and in touch with the above-mentioned passivation layer 20. The first metal layer is formed over the adhesion/barrier layer, the second metal layer is formed on the first metal layer, and the third metal layer is formed on the second metal layer. The adhesion/barrier layer may comprise titanium, a titanium-tungsten alloy, titanium nitride, tantalum or tantalum nitride, for example. Alternatively, the adhesion/barrier layer may be formed by depositing a chromium layer and then depositing a chromium-copper layer on the chromium layer. The first metal layer may have a thickness thicker than 1 μm, and preferably between 2 μm and 30 μm, wherein the first metal layer may comprise copper with greater than 90 weight percent, and, preferably, greater than 97 weight percent. The second metal layer comprises nickel, for example, and has a thickness thicker than 1 μm, and preferably between 2 μm and 5 μm. The third metal layer is made of gold, for example, and has a thickness thicker than 100 angstroms, and preferably between 1 μm and 1000 angstroms. Alternatively, a seed layer, such as copper, can be sputtered on the adhesion/barrier layer, then the first metal layer is electroplated on the seed layer, then the second metal layer is electroplated on the first metal layer, and then the third metal layer is electroplated on the second metal layer.

The above-mentioned metal circuit layers 26a, 26b, 26c, 28, 30 and 32 may have a resistance times capacitance (RC product) of between about 5 and 50 times smaller than the RC product of the interconnection lines underlying the passivation layer 20, and preferably about 10 times smaller.

The bumps 24 and 25 as shown In FIGS. 1-4 may not be limited to the above description. Alternatively, the bump 24 or 25 can be divided into two groups. One group is reflowable or solder bump that comprises solder or other reflowable metals or metal alloys at the topmost of the reflowable or solder bump. The reflowable bumps are usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The reflowable bump starts to reflow when the temperature reaches the melting temperature of solder, or reflowable metal, or reflowable metal alloys (i.e. is roughly the peak temperature) for over 20 seconds. The period of the whole temperature profile takes over 2 minutes, typically 5 to 45 minutes. In summary, the bumps are reflowed at the temperature of between 150 and 350 celsius degrees for more than 20 seconds or for more than 2 minutes. The reflowable bump comprises solder or other metals or alloys with melting point of between 150 and 350 celsius degrees. The reflowable bump comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 celsius degrees, or greater than 200 celsius degrees, or greater than 250 celsius degrees. The other group is non-reflowable or non-solder bump that cannot be reflowed at the temperature of greater than 350 celsius degrees for more than 20 seconds or for more than 2 minutes. Each component of the non-reflowable or the non-solder bump does not reflow at the temperature of more than 350 celsius degrees for more than 20 seconds or for more than 2 minutes. The non-reflowable bump comprises metals or metal alloys with a melting point greater than 350 celsius degrees or greater than 400 celsius degrees, or greater than 600 celsius degrees. Moreover, the non-reflowable bump does not comprise any metals or metal alloys with melting temperature lower than 350 celsius degrees. The non-reflowable bump may have a topmost metal layer comprising gold with greater than 90 weight percent and, preferably, greater than 97 weight percent. Alternatively, the non-reflowable bump may have a topmost metal layer with gold ranging from 0 weight percent to 90 weight percent, or ranging from 0 weight percent to 50 weight percent, or ranging from 0 weight percent to 10 weight percent.

In this paragraph, the detailed non-reflowable or non-solder bump used for the bumps 24 as shown in FIGS. 1-4 is discussed. The bump 24 may only have a single metal layer having a thickness thicker than 5 μm, and preferably between 7 μm and 30 μm, for example. The single metal layer may comprise gold with greater than 90 weight percent, and, preferably, greater than 97 weight percent. Alternatively, the single metal layer may comprise copper with greater than 90 weight percent, and, preferably, greater than 97 weight percent. Alternatively, the single metal layer may comprise platinum with greater than 90 weight percent, and, preferably, greater than 97 weight percent. Alternatively, the single metal layer may comprise silver with greater than 90 weight percent, and, preferably, greater than 97 weight percent. Alternatively, the single metal layer may comprise palladium with greater than 90 weight percent, and, preferably, greater than 97 weight percent. Alternatively, the single metal layer may comprise rhodium with greater than 90 weight percent, and, preferably, greater than 97 weight percent. Alternatively, the bump 24 may be formed by depositing an adhesion/barrier layer and a bulk metal layer. The adhesion/barrier layer may be formed by electroplating a nickel layer on the metal circuit layer. The bulk metal layer may be electroplated with a thickness greater than 5 μm, preferably between 12 μm and 30 μm, on the adhesion/barrier layer made of nickel, wherein the bulk metal layer may comprise gold with greater than 90 weight percent, and, preferably, greater than 97 weight percent. Alternatively, the bulk metal layer may be electroplated with a thickness greater than 5 μm and, preferably, between 7 μm and 3 μm on the adhesion/barrier layer made of nickel, wherein the bulk metal layer may comprise copper with greater than 90 weight percent, and, preferably, greater than 97 weight percent. Alternatively, the bulk metal layer may be electroplated with a thickness greater than 5 μm and, preferably, between 7 μm and 30 μm on the adhesion/barrier layer made of nickel, wherein the bulk metal layer may comprise silver with greater than 90 weight percent, and, preferably, greater than 97 weight percent. Alternatively, the bulk metal layer may be electroplated with a thickness greater than 5 μm and, preferably, between 7 μm and 30 μm on the adhesion/barrier layer made of nickel, wherein the bulk metal layer may comprise platinum with greater than 90 weight percent, and, preferably, greater than 97 weight percent. Alternatively, the bulk metal layer may be electroplated with a thickness greater than 5 μm and, preferably, between 7 μm and 30 μm on the adhesion/barrier layer made of nickel, wherein the bulk metal layer may comprise palladium with greater than 90 weight percent, and, preferably, greater than 97 weight percent. Alternatively, the bulk metal layer may be electroplated with a thickness greater than 5 μm and, preferably, between 7 μm and 30 μm on the adhesion/barrier layer made of nickel, wherein the bulk metal layer may comprise rhodium with greater than 90 weight percent, and, preferably, greater than 97 weight percent. The above-mentioned various bumps 24 can be formed on the metal circuit layers 26a, 26b, 26c, 28, 30 and 32 with any one of the above-mentioned structures.

In this paragraph, the detailed reflowable or solder bump used for the bumps 24 as shown in FIGS. 1-4 is discussed. The bumps 24 may be formed by depositing an adhesion/barrier layer and a bulk metal layer. The adhesion/barrier layer may be formed by electroplating a nickel layer on the metal circuit layer 26a, 26b, 2c, 28, 30 or 32. The bulk metal layer may be formed by electroplating a solder layer with a thickness between 25 μm and 300 μm on the adhesion/barrier layer made of nickel, wherein the solder layer may be a tin-lead alloy, a tin-silver-copper alloy, a tin-silver alloy or other solder material. The above-mentioned various bumps 24 can be formed on the metal circuit layer 26a, 26b, 26c, 28, 30 and 32 with any one of the above-mentioned structures.

In this paragraph, the detailed non-reflowable or non-solder bump used for the bump 25 as shown in FIG. 4 is discussed. The bump 25 may be formed by sputtering an adhesion/barrier layer on a contact point of the topmost fine line metal layer 18 and then electroplating a bulk metal layer on the adhesion/barrier layer. The bump 25 may be formed by sputtering a titanium-tungsten alloy, functioning as a adhesion/barrier layer, on a contact point of the topmost fine line metal layer 18, and then electroplating a bulk metal layer with a thickness greater than 5 μm, and preferably between 7 μm and 100 μm, on the adhesion/barrier layer, wherein the bulk metal layer may comprise gold with greater than 90 weight percent, and, preferably, greater than 97 weight percent, or the bulk metal layer may comprise copper with greater than 90 weight percent, and, preferably, greater than 97 weight percent, or the bulk metal layer may comprise silver with greater than 90 weight percent, and, preferably, greater than 97 weight percent, or the bulk metal layer may comprise platinum with greater than 90 weight percent, and, preferably, greater than 97 weight percent, or the bulk metal layer may comprise palladium with greater than 90 weight percent, and, preferably, greater than 97 weight percent, or the bulk metal layer may comprise rhodium with greater than 90 weight percent, and, preferably, greater than 97 weight percent. The above-mentioned various bumps 25 can be formed with the metal circuit 32 having any one of the above-mentioned structures and the bumps 24 having any one of the above-mentioned structures.

In this paragraph, the detailed reflowable or solder bump used for the bump 25 as shown in FIG. 4 is discussed. The bump 25 may be formed by sputtering an adhesion/barrier layer on a contact point of the topmost fine line metal layer 18 and then electroplating a bulk metal layer on the adhesion/barrier layer. The bump 25 may be formed by sputtering titanium, a titanium-tungsten alloy, chromium or a chromium-copper alloy, functioning as an adhesion/barrier layer, on a contact point of the topmost fine line metal layer 18, sputtering a copper layer, functioning as a seed layer, on the adhesion/barrier layer, electroplating another copper layer on the seed layer, electroplating a nickel layer on the top copper layer, and then electroplating a solder layer with a thickness between 25 μm and 300 μm, wherein the solder layer may be a tin-lead alloy, a tin-silver-copper alloy, a tin-silver alloy or other solder materials. The above-mentioned various bump 25 can be formed with the metal circuit 32 having any one of the above-mentioned structures and the bumps 24 having any one of the above-mentioned structures.

Figure 5:
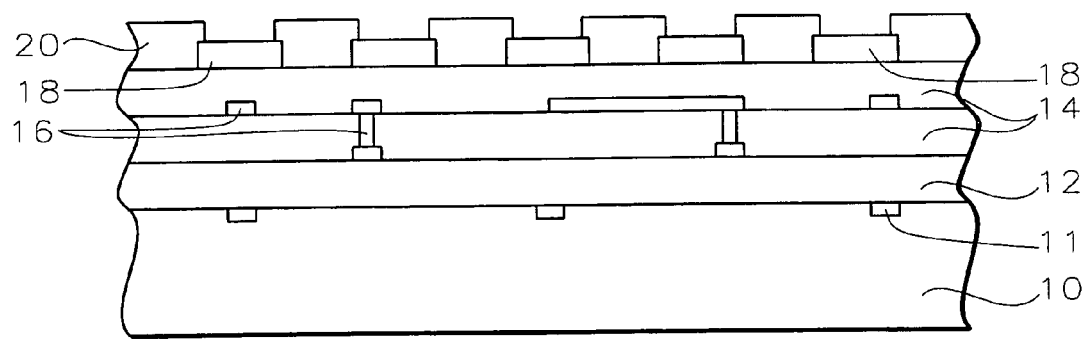
FIGS. 5 through 11 are cross-sectional views of a first preferred embodiment of the method of the present invention.

Referring now to FIGS. 5-12, the process of manufacturing the above-mentioned circuits and bumps of the present invention will be described. Referring now more particularly to FIG. 5, there is shown a wafer having contact pads, such as I/O pads, as illustrated in FIGS. 1-4. Openings have been made in the passivation layer 20 to the contact pads of the topmost fine line metal layer 18.

Figure 6:
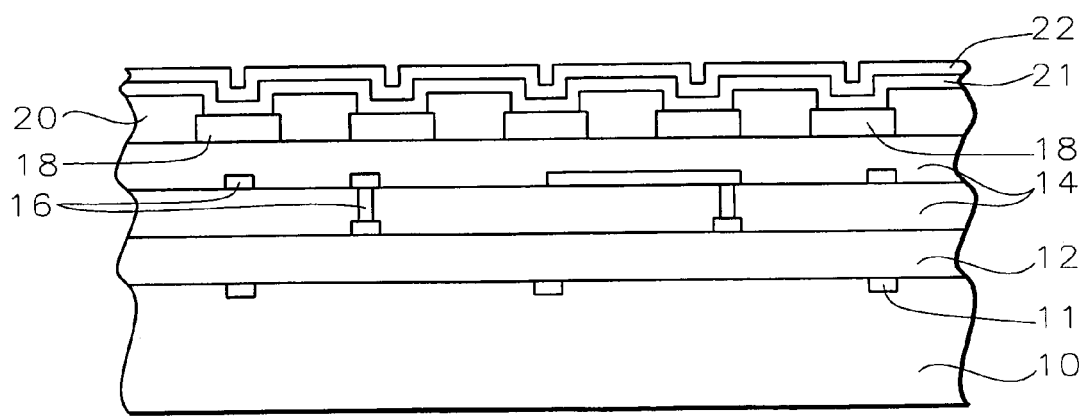

Referring now to FIG. 6, an adhesion and diffusion barrier layer 21 is deposited by sputtering or chemical vapor depositing on the passivation layer 20 and the contact pads of the topmost fine line metal layer 18. The adhesion/barrier layer may comprise TiW, Ti, TaN, TiN, Ta, Cr or a CrCu alloy and have a thickness of between about 1000 and 10,000 Angstroms. Next, a seed layer 22 is deposited by sputtering or electroplating on the adhesion/barrier layer. The seed layer 22 may comprise gold or copper having a thickness of between about 1000 and 10,000 Angstroms. In a first case, a seed layer of gold may be sputtered or electroplated on an adhesion/barrier layer of TiW. In another case, a seed layer of copper may be sputtered or electroplated on an adhesion/barrier layer of Ti.

Figure 7:
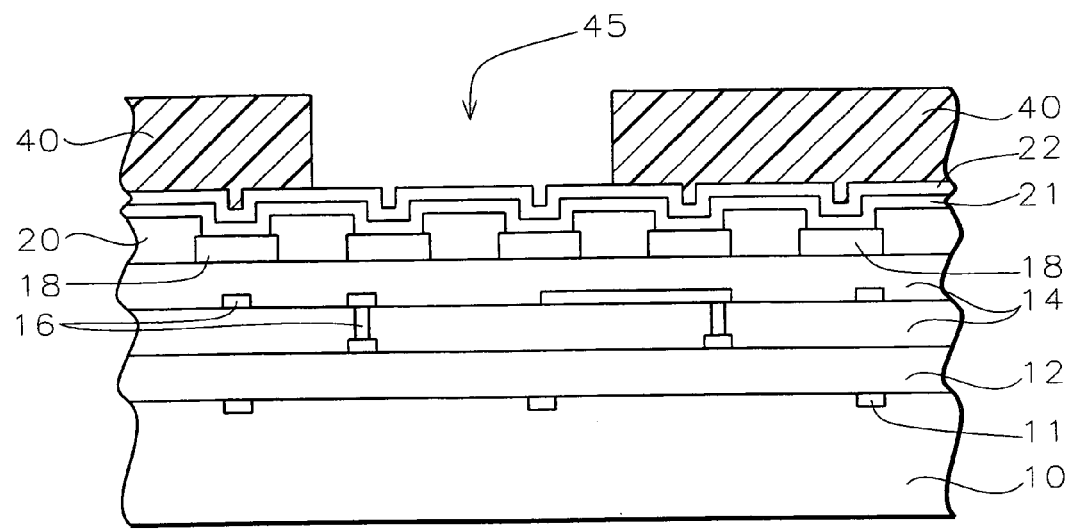

The wafer is coated with photoresist. The photoresist is patterned using a lithographic process to form a photoresist mask 40. An opening 45 is formed through the photoresist mask 40 and exposes the gold or copper seed layer, as shown in FIG. 7.

Figure 8:
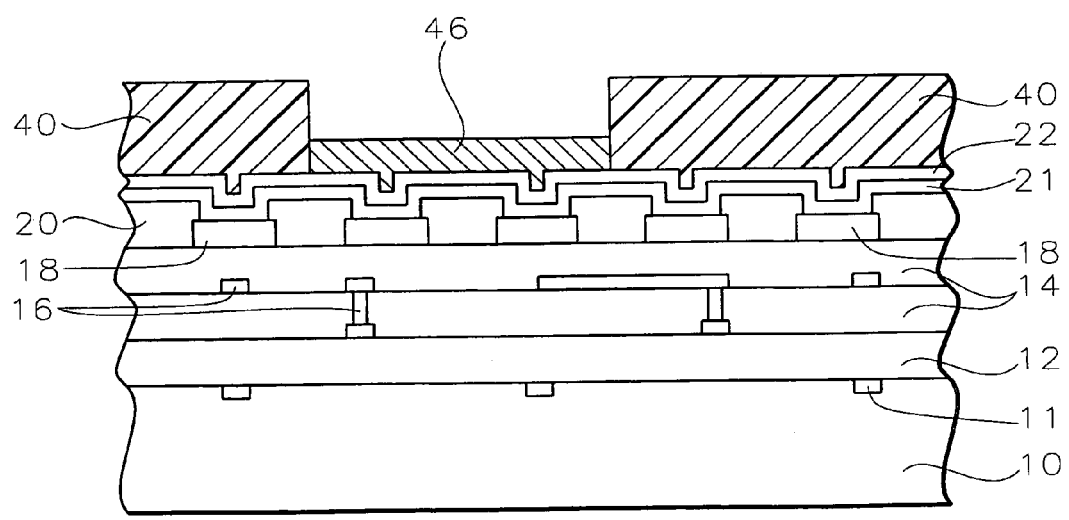

Using an electroplating process, a metal layer 46 is selectively deposited on the gold or copper seed layer 22 exposed by the opening 45 in the photoresist mask 40, as shown in FIG. 8. In a first case, the metal layer 46 can be formed by electroplating a bulk metal layer having a thickness thicker than 1 μm, and preferably between 2 μm and 30 μm, and comprising gold with greater than 90 weight percent, and, preferably, greater than 97 weight percent on the seed layer 22, preferably made of gold, exposed by the opening 45 in the photoresist mask 40. In another example, the metal layer 46 can be formed by electroplating a bulk metal layer having a thickness thicker than 1 μm, and preferably between 2 μm and 30 μm, and comprising copper with greater than 90 weight percent, and, preferably, greater than 97 weight percent on the seed layer 22, preferably made of copper, exposed by the opening 45 in the photoresist mask 40. In another case, the metal layer 46 can be formed by electroplating a first metal layer having a thickness thicker than 1 μm, and preferably between 2 μm and 30 μm, and comprising copper with greater than 90 weight percent, and, preferably, greater than 97 weight percent on the seed layer 22, preferably made of copper, exposed by the opening 45 in the photoresist mask 40, and then electroplating a second metal layer having a thickness thicker than 1 μm, and preferably between 2 μm and 5 μm and comprising nickel with greater than 90 weight percent, and, preferably, greater than 97 weight percent on the first metal layer. In another case, the metal layer 46 can be formed by electroplating a first metal layer having a thickness thicker than 1 μm, and preferably between 2 μm and 30 μm, and comprising copper with greater than 90 weight percent, and, preferably, greater than 97 weight percent on the seed layer 22, preferably made of copper, exposed by the opening 45 in the photoresist mask 40, then electroplating a second metal layer having a thickness thicker than 1 μm, and preferably between 2 μm and 5 μm and comprising nickel with greater than 90 weight percent, and, preferably, greater than 97 weight percent on the first metal layer, and then electroplating a third metal layer having a thickness thicker than 100 angstroms, and preferably between 1000 angstroms and 1 μm and comprising gold with greater than 90 weight percent, and, preferably, greater than 97 weight percent on the second metal layer.

Figure 9:
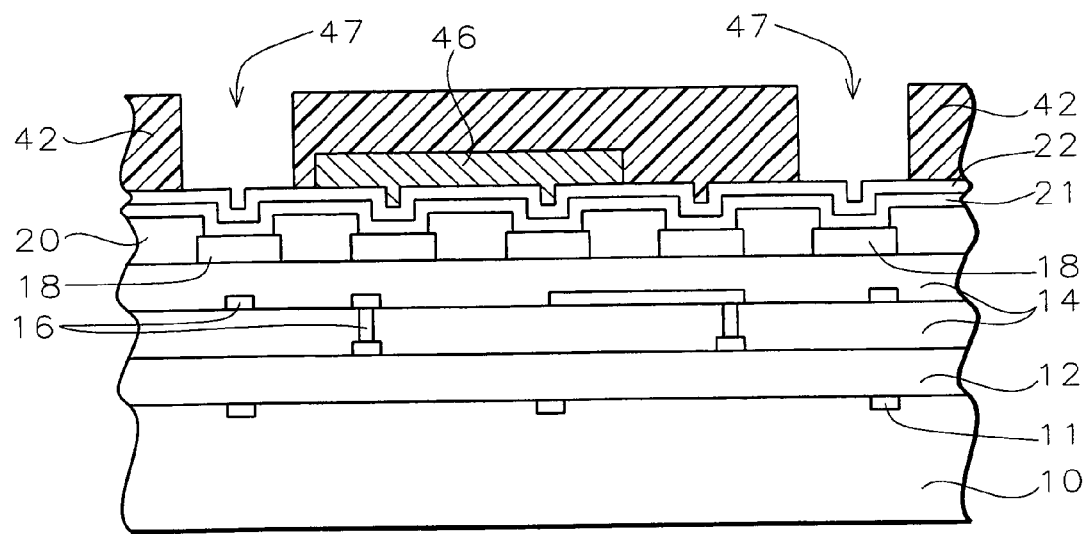

After forming the metal layer 46, the photoresist mask 40 is removed. Now, a second photoresist mask 42 is formed, covering the metal layer 46. Multiple openings 47 are formed in the second photoresist mask 42 to expose the seed layer 22 over the contact pad of the topmost thin film metal layer 18, as shown in FIG. 9.

Figure 10:
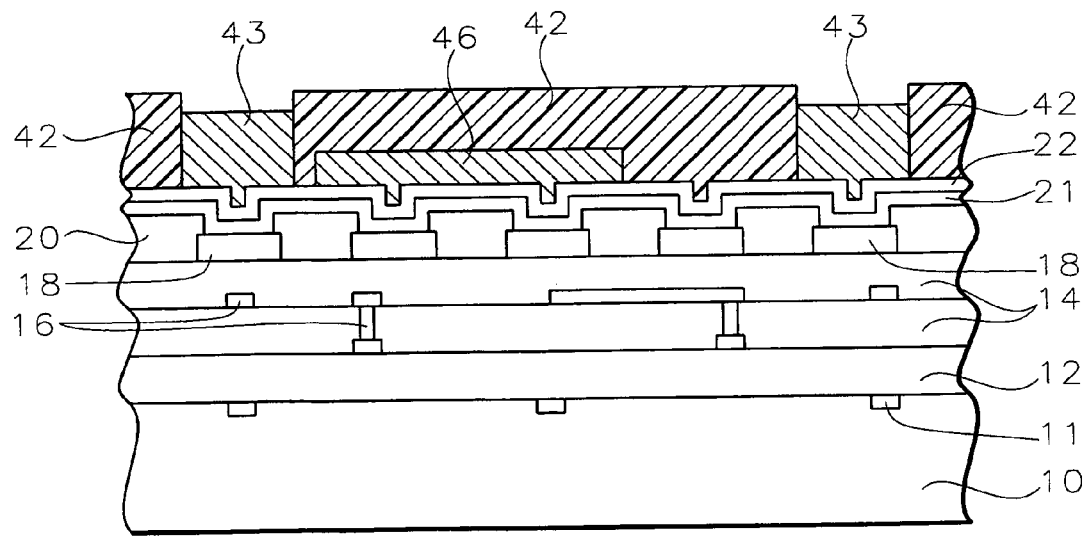

Thereafter, a metal layer 43 used to form bumps can be electroplated on the seed layer 22 exposed by the opening 47 in the second photoresist mask 42, as illustrated in FIG. 10. In a first case, the metal layer 43 can be formed by electroplating a bulk metal layer having a thickness thicker than 5 μm, and preferably between 7 μm and 100 μm, and comprising gold with greater than 90 weight percent, and, preferably, greater than 97 weight percent on the seed layer 22, preferably made of gold, exposed by the opening 47 in the photoresist mask 42. In another case, the metal layer 43 can be formed by electroplating a bulk metal layer having a thickness thicker than 5 μm, and preferably between 7 μm and 100 μm, and comprising copper with greater than 90 weight percent, and, preferably, greater than 97 weight percent on the seed layer 22, preferably made of copper, exposed by the opening 47 in the photoresist mask 42. In another case, the metal layer 43 can be formed by electroplating a bulk metal layer having a thickness thicker than 5 μm, and preferably between 7 μm and 100 μm, and comprising silver with greater than 90 weight percent, and, preferably, greater than 97 weight percent on the seed layer 22, preferably made of silver, exposed by the opening 47 in the photoresist mask 42. In another case, the metal layer 43 can be formed by electroplating a bulk metal layer having a thickness thicker than 5 μm, and preferably between 7 μm and 100 μm, and comprising platinum with greater than 90 weight percent, and, preferably, greater than 97 weight percent on the seed layer 22, preferably made of platinum, exposed by the opening 47 in the photoresist mask 42. In another case, the metal layer 43 can be formed by electroplating a bulk metal layer having a thickness thicker than 5 μm, and preferably between 7 μm and 100 μm, and comprising palladium with greater than 90 weight percent, and, preferably, greater than 97 weight percent on the seed layer 22, preferably made of palladium, exposed by the opening 47 in the photoresist mask 42. In another case, the metal layer 43 can be formed by electroplating a bulk metal layer having a thickness thicker than 5 μm, and preferably between 7 μm and 100 μm, and comprising rhodium with greater than 90 weight percent, and, preferably, greater than 97 weight percent on the seed layer 22, preferably made of rhodium, exposed by the opening 47 in the photoresist mask 42. In another case, the metal layer 43 can be formed by electroplating a first metal layer having a thickness thicker than 1 μm, and preferably between 2 μm and 10 μm, and comprising copper with greater than 90 weight percent, and, preferably, greater than 97 weight percent on the seed layer 22, preferably made of copper, exposed by the opening 47 in the photoresist mask 42, then electroplating a second metal layer having a thickness thicker than 1 μm, and preferably between 1 μm and 5 μm, and comprising nickel with greater than 90 weight percent, and, preferably, greater than 97 weight percent on the first metal layer, and then electroplating a solder layer having a thickness between 25 μm and 300 μm and comprising a lead-containing solder material, such as a tin-lead alloy, or a lead-free solder material, such as a tin-silver alloy or a tin-silver-copper alloy, on the second metal layer.

Figure 11:
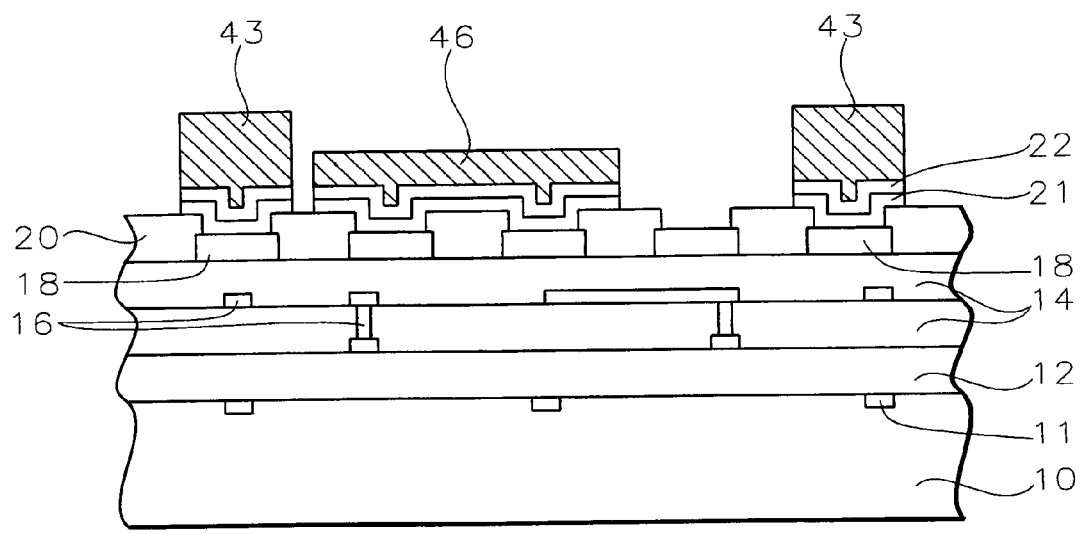

After forming the metal layer 43, the photoresist mask 42 is removed. Thereafter the seed layer 22 and the adhesion/barrier layer 21 are selectively removed where they are not covered by the metal layers 46 and 43, as shown in FIG. 11.

Figure 12:
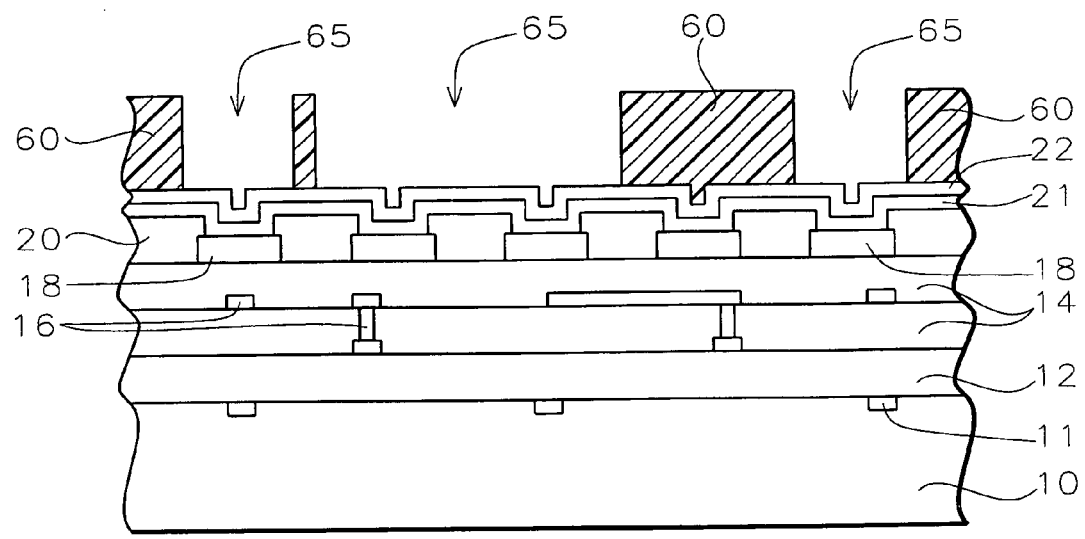
FIGS. 12 through 16 are cross-sectional views of a second preferred embodiment of the method of the present invention.
Figure 13:
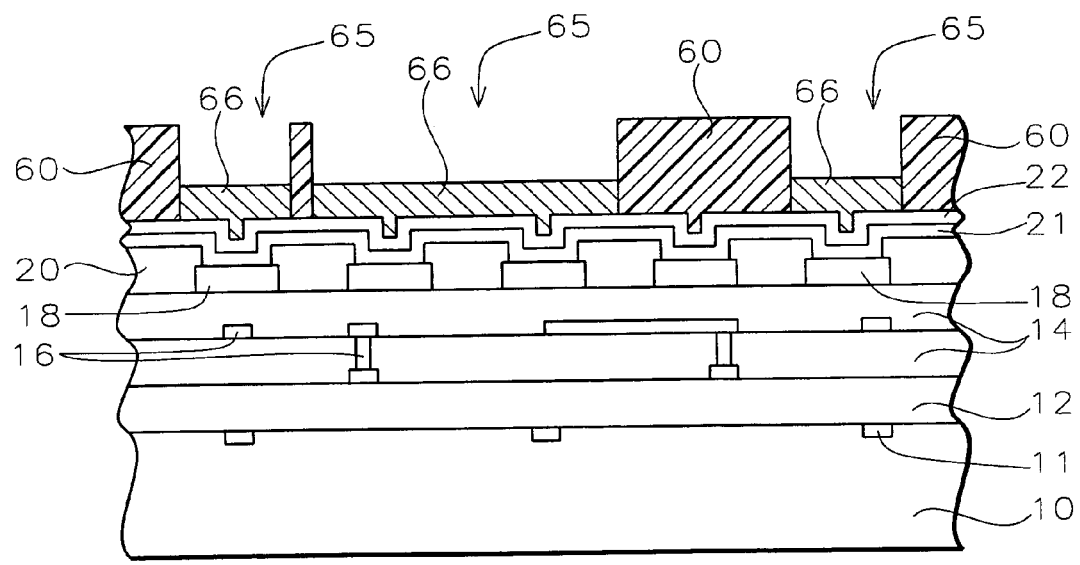
Figure 14:
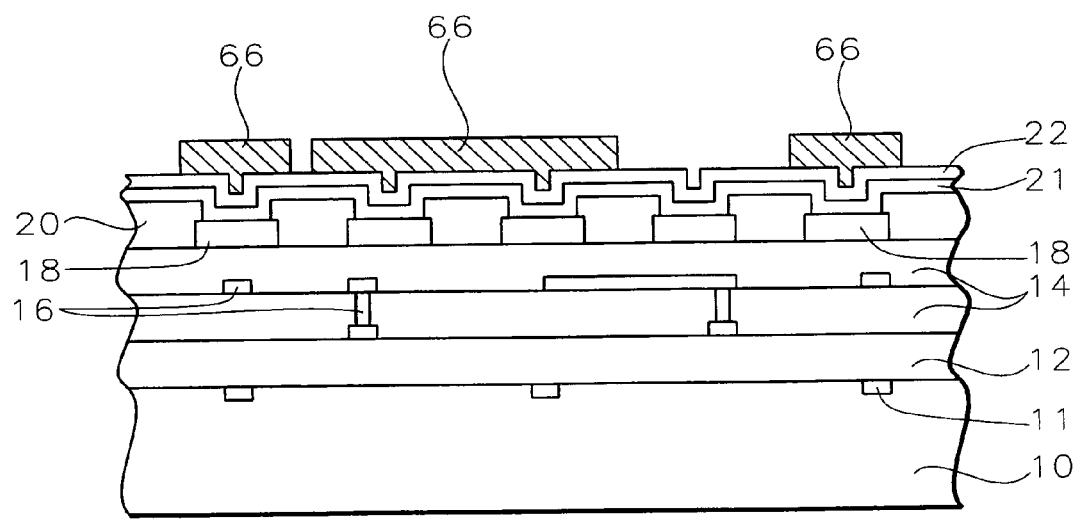

In a second preferred embodiment for a method of manufacturing of the present invention, multiple bumps can be formed on a metal circuit layer. Processing proceeds as described above through FIG. 6. Then, as shown in FIG. 12, a photoresist mask 60 is formed on the seed layer 22. Multiple openings 65 are formed in the photoresist mask 60 and expose the seed layer 22. Thereafter, as shown in FIG. 13, using an electroplating process, a metal layer 66 is selectively deposited on the gold or copper seed layer 22 exposed by the opening 65 in the photoresist mask 60. In a first case, the metal layer 66 can be formed by electroplating a bulk metal layer having a thickness thicker than 1 μm, and preferably between 2 μm and 30 μm, and comprising gold with greater than 90 weight percent, and, preferably, greater than 97 weight percent on the seed layer 22, preferably made of gold, exposed by the opening 45 in the photoresist mask 40. In a second case, the metal layer 66 can be formed by electroplating a bulk metal layer having a thickness thicker than 1 μm, and preferably between 2 μm and 30 μm, and comprising copper with greater than 90 weight percent, and, preferably, greater than 97 weight percent on the seed layer 22, preferably made of copper, exposed by the opening 45 in the photoresist mask 40. In a third case, the metal layer 66 can be formed by electroplating a first metal layer having a thickness thicker than 1 μm, and preferably between 2 μm and 30 μm, and comprising copper with greater than 90 weight percent, and, preferably, greater than 97 weight percent on the seed layer 22, preferably made of copper, exposed by the opening 45 in the photoresist mask 40, and then electroplating a second metal layer having a thickness thicker than 1 μm, and preferably between 2 μm and 5 μm and comprising nickel with greater than 90 weight percent, and, preferably, greater than 97 weight percent on the first metal layer. In a fourth case, the metal layer 66 can be formed by electroplating a first metal layer having a thickness thicker than 1 μm, and preferably between 2 μm and 30 μm, and comprising copper with greater than 90 weight percent, and, preferably, greater than 97 weight percent on the seed layer 22, preferably made of copper, exposed by the opening 45 in the photoresist mask 40, then electroplating a second metal layer having a thickness thicker than 1 μm, and preferably between 2 μm and 5 μm and comprising nickel with greater than 90 weight percent, and, preferably, greater than 97 weight percent on the first metal layer, and then electroplating a third metal layer having a thickness thicker than 100 angstroms, and preferably between 1000 angstroms and 1 μm and comprising gold with greater than 90 weight percent, and, preferably, greater than 97 weight percent on the second metal layer. After the metal layer 66 is formed, the photoresist mask 60 is removed, as shown in FIG. 14.

Figure 15:
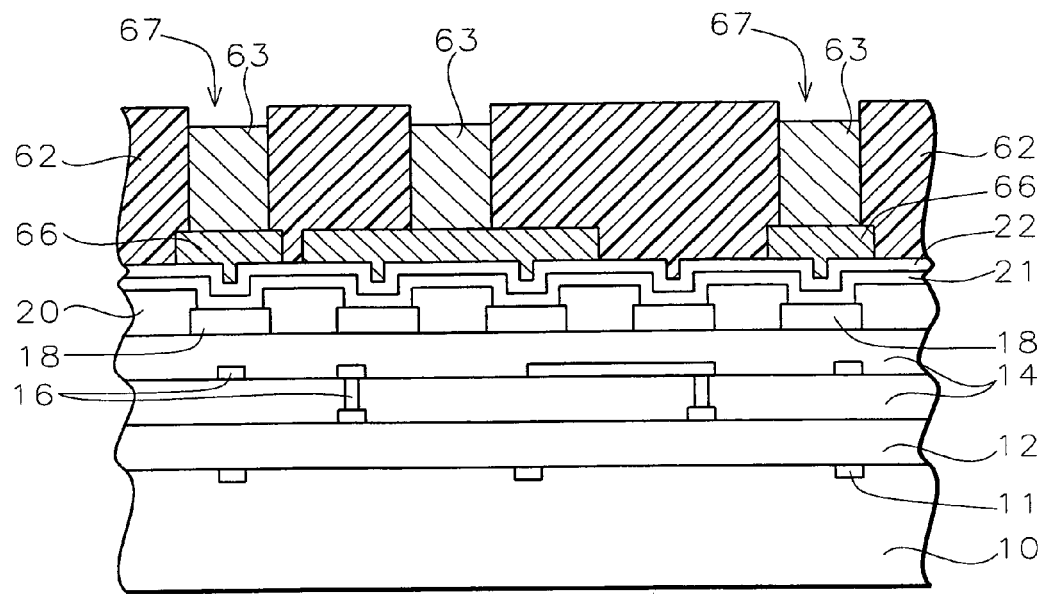

Now, a second photoresist mask 62 is formed on the seed layer 22 and the metal layer 66 where no bump will be formed, as shown in FIG. 15. Multiple openings 67 are formed in the photoresist mask 62 and expose the metal layer 66 over the contact pad of the topmost fine line metal layer. Thereafter, a metal layer 63 used to form bumps can be electroplated on the metal layer 66 exposed by the opening 67 in the second photoresist mask 62, as illustrated in FIG. 15. In a first case, the metal layer 63 can be formed by electroplating a bulk metal layer having a thickness thicker than 5 μm, and preferably between 7 μm and 30 μm, and comprising gold with greater than 90 weight percent, and, preferably, greater than 97 weight percent on the metal layer 66, preferably, with the structure described in the above-mentioned first or fourth case, exposed by the opening 67 in the photoresist mask 62. In another case, the metal layer 63 can be formed by electroplating a bulk metal layer having a thickness thicker than 5 μm, and preferably between 7 μm and 30 μm, and comprising copper with greater than 90 weight percent, and, preferably, greater than 97 weight percent on the metal layer 66, preferably, with the structure described in the above-mentioned second case, exposed by the opening 67 in the photoresist mask 62. In another case, the metal layer 63 can be formed by electroplating a bulk metal layer having a thickness thicker than 5 μm, and preferably between 7 μm and 30 μm, and comprising silver with greater than 90 weight percent, and, preferably, greater than 97 weight percent on the metal layer 66, preferably, with a topmost silver layer, exposed by the opening 67 in the photoresist mask 62. In another case, the metal layer 63 can be formed by electroplating a bulk metal layer having a thickness thicker than 5 μm, and preferably between 7 μm and 30 μm, and comprising platinum with greater than 90 weight percent, and, preferably, greater than 97 weight percent on the metal layer 66, preferably, with a topmost platinum layer, exposed by the opening 67 in the photoresist mask 62. In another case, the metal layer 63 can be formed by electroplating a bulk metal layer having a thickness thicker than 5 μm, and preferably between 7 μm and 30 μm, and comprising palladium with greater than 90 weight percent, and, preferably, greater than 97 weight percent on the metal layer 66, preferably, with a topmost palladium layer, exposed by the opening 67 in the photoresist mask 62. In another case, the metal layer 43 can be formed by electroplating a bulk metal layer having a thickness thicker than 5 μm, and preferably between 7 μm and 30 μm, and comprising rhodium with greater than 90 weight percent, and, preferably, greater than 97 weight percent on the metal layer 66, preferably, with a topmost rhodium layer, exposed by the opening 67 in the photoresist mask 62. In another case, the metal layer 63 can be formed by electroplating a solder layer having a thickness thicker than 10 μm, and preferably between 25 μm and 300 μm, and comprising a lead-containing solder material, such as a tin-lead alloy, or a lead-free solder material, such as a tin-silver alloy or a tin-silver-copper alloy, on the metal layer 66, preferably, with the structure described in the above-mentioned third case, exposed by the opening 67 in the photoresist mask 62.

Alternatively, the metal layer 63 may be formed with an adhesion/barrier layer. In a first case, the metal layer 63 can be formed by electroplating an adhesion/barrier layer on the metal layer 66, preferably, with the structure described in the above-mentioned first, second, third or fourth case, exposed by the opening 67 in the photoresist mask 62, and then electroplating a bulk metal layer on the adhesion/barrier layer. The adhesion/barrier layer may have a thickness thicker than 1 μm, and preferably between 1 μm and 5 μm, and may comprise nickel with greater than 90 weight percent, and, preferably, greater than 97 weight percent. The bulk metal layer may have a thickness thicker than 5 μm, and preferably between 7 μm and 30 μm, and may comprise gold with greater than 90 weight percent, and, preferably, greater than 97 weight percent. Alternatively, the bulk metal layer may have a thickness thicker than 5 μm, and preferably between 7 μm and 30 μm, and may comprises copper with greater than 90 weight percent, and, preferably, greater than 97 weight percent. Alternatively, the bulk metal layer may have a thickness thicker than 5 μm, and preferably between 7 μm and 30 μm, and may comprises silver with greater than 90 weight percent, and, preferably, greater than 97 weight percent. Alternatively, the bulk metal layer may have a thickness thicker than 5 μm, and preferably between 7 μm and 30 μm, and may comprises platinum with greater than 90 weight percent, and, preferably, greater than 97 weight percent. Alternatively, the bulk metal layer may have a thickness thicker than 5 μm, and preferably between 7 μm and 30 μm, and may comprises palladium with greater than 90 weight percent, and, preferably, greater than 97 weight percent. Alternatively, the bulk metal layer may have a thickness thicker than 5 μm, and preferably between 7 μm and 30 μm, and may comprises rhodium with greater than 90 weight percent, and, preferably, greater than 97 weight percent. In another case, the metal layer 63 can be formed by electroplating an adhesion/barrier layer on the metal layer 66, preferably, with the structure described in the above-mentioned first, second, third or fourth case, exposed by the opening 67 in the photoresist mask 62, and then electroplating a solder layer on the adhesion/barrier layer. The adhesion/barrier layer may have a thickness thicker than 1 μm, and preferably between 1 μm and 5 μm, and may comprise nickel with greater than 90 weight percent, and, preferably, greater than 97 weight percent. The solder layer may have a thickness thicker than 10 μm, and preferably between 25 μm and 300 μm, and may comprises a lead-containing solder material, such as a tin-lead alloy, or a lead-free solder material, such as a tin-silver alloy or a tin-silver-copper alloy.

Figure 16:
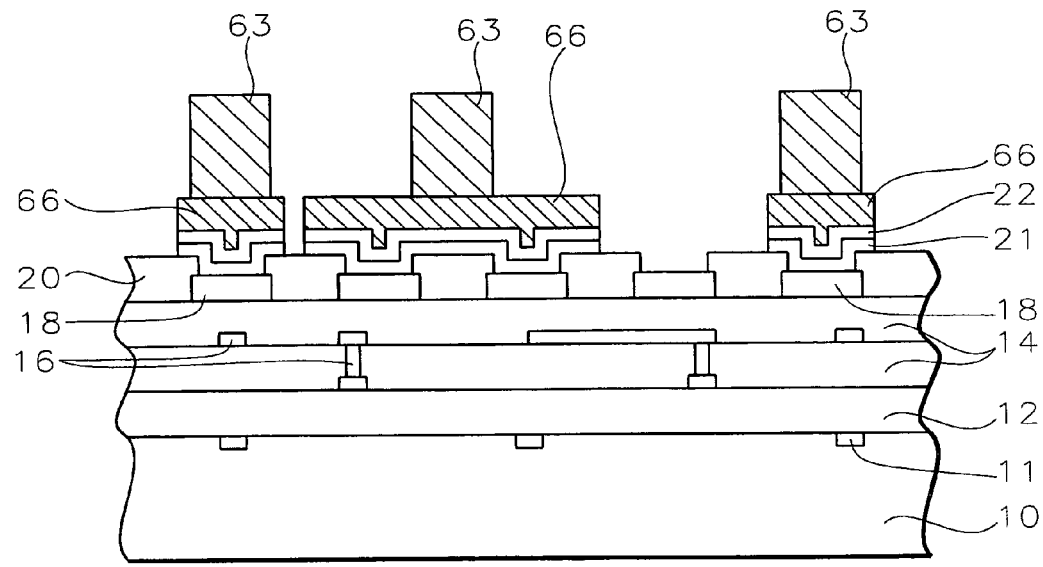

After forming the metal layer 63 on the metal layer 66, the photoresist mask 62 is removed. Thereafter, the seed layer 22 and the adhesion/barrier layer 21 not covered by the metal layer 66 are then removed, as shown in FIG. 16.

The above-mentioned process as shown in FIGS. 12-16 can be applied to form the metal circuits 26a, 26b, 26c, 28, 30 and 32 and the bumps 24 shown in FIGS. 1-4.

The above-mentioned process for forming the circuit lines and the bumps is performed over a semiconductor wafer. After the circuit lines and the bumps are deposited over the semiconductor wafer, the semiconductor wafer is divided into multiple chips using a cutting process.

While this invention has been particularly shown and described with reference to the preferred embodiments thereof, it will be understood by those skilled in the art that various changes in form and details may be made without departing from the spirit and scope of the invention.

What is claimed is:

1. A method for fabricating a chip-on-glass assembly for an LCD driver IC die, comprising:
   providing a wafer with a semiconductor substrate, a transistor in and on said semiconductor substrate, a first metal layer over said semiconductor substrate, a second metal layer over said semiconductor substrate and over said first metal layer, a dielectric layer between said first and second metal layers, a passivation layer over said semiconductor substrate, over said first and second metal layers and over said dielectric layer, wherein said passivation layer comprises a nitride layer having a thickness between 0.2 and 1.2 micrometers, and a contact pad over said semiconductor substrate, wherein said contact pad is exposed by an opening in said passivation layer;

sputtering a titanium-containing layer over said wafer, wherein said titanium-containing layer has a thickness between 1,000 and 10,000 Angstroms;

sputtering a first gold layer on said titanium-containing layer;

depositing a first photoresist layer on said first gold layer, wherein an opening in said first photoresist layer is over said first gold layer and exposes said first gold layer;

electroplating a second gold layer on said first gold layer exposed by said opening in said first photoresist layer, wherein said second gold layer has a thickness between 2 and 30 micrometers;

removing said first photoresist layer;

after said removing said first photoresist layer, depositing a second photoresist layer directly on said first and second gold layers, wherein an opening in said second photoresist layer is over said second gold layer and exposes said second gold layer;

electroplating a gold bump directly on said second gold layer exposed by said opening in said second photoresist layer, wherein said gold bump has a thickness between 7 and 100 micrometers and smaller than a thickness of said second photoresist layer;

after said electroplating said gold bump, removing said second photoresist layer;

after said removing said second photoresist layer, removing said titanium-containing layer and said first gold layer not under said second gold layer; and connecting said gold bump to a glass substrate.

2. The method according to claim 1, wherein said titanium-containing layer comprises a titanium-tungsten alloy.

3. The method according to claim 1, wherein said second gold layer comprises gold with greater than 90 weight percent.

4. The method according to claim 1, wherein said gold bump comprises gold with greater than 90 weight percent.

5. The method according to claim 1, wherein said passivation layer further comprises an oxide layer under said nitride layer.

6. The method according to claim 1, wherein said thickness of said gold bump is greater than said thickness of said second gold layer.

7. A method for fabricating a chip-on-glass assembly for an LCD driver IC die, comprising:

sputtering a titanium-containing layer over a semiconductor substrate, wherein said titanium-containing layer has a thickness between 1,000 and 10,000 Angstroms;

sputtering a first gold layer over said semiconductor substrate and on said titanium- containing layer;

depositing a first photoresist layer on said first gold layer, wherein an opening in said first photoresist layer is over said first gold layer and exposes said first gold layer;

electroplating a second gold layer on said first gold layer exposed by said opening in said first photoresist layer, wherein said second gold layer has a thickness between 2 and 30 micrometers;

removing said first photoresist layer;

depositing a second photoresist layer over said first and second gold layers, wherein an opening in said second photoresist layer is over said second gold layer and exposes said second gold layer;

electroplating a gold bump directly on said second gold layer exposed by said opening in said second photoresist layer, wherein said gold bump has a thickness between 7 and 100 micrometers;

after said electroplating said gold bump, removing said second photoresist layer;

after said removing said second photoresist layer, removing said titanium-containing layer and said first gold layer not under said second gold layer; and connecting said gold bump to a glass substrate.

8. The method according to claim 7, wherein said titanium-containing layer comprises a titanium-tungsten alloy.

9. The method according to claim 7, wherein said second gold layer comprises gold with greater than 90 weight percent.

10. The method according to claim 7, wherein said gold bump comprises gold with greater than 90 weight percent.

11. The method according to claim 7, wherein said removing said first photoresist layer is followed by said depositing said second photoresist layer.

12. A method for fabricating a chip-on-glass assembly for an LCD driver IC die, comprising:

providing a wafer with a semiconductor substrate, a transistor in and on said semiconductor substrate, a first metal layer over said semiconductor substrate, a second metal layer over said semiconductor substrate and over said first metal layer, a dielectric layer between said first and second metal layers, a passivation layer over said semiconductor substrate, over said first and second metal layers and over said dielectric layer, wherein said passivation layer comprises a nitride layer having a thickness between 0.2 and 1.2 micrometers, and a contact pad over said semiconductor substrate, wherein said contact pad is exposed by an opening in said passivation layer;

sputtering an adhesion/barrier layer over said wafer;

sputtering a first metal layer over said adhesion/barrier layer;

depositing a first photoresist layer on said first metal layer, wherein an opening in said first photoresist layer is over said first metal layer and exposes said first metal layer;

electroplating a second metal layer directly on said first metal layer exposed by said opening in said first photoresist layer, wherein said second metal layer has a thickness between 2 and 30 micrometers;

removing said first photoresist layer;

depositing a second photoresist layer over said first and second metal layers, wherein an opening in said second photoresist layer is over said second metal layer and exposes said second metal layer;

forming a gold layer over said second metal layer under said opening in said second photoresist layer;

after said forming said gold layer, removing said second photoresist layer;

after said removing said second photoresist layer, removing said adhesion/barrier layer and said first metal layer not under said second metal layer; and connecting said gold layer to a glass substrate.

13. The method according to claim 12, wherein said adhesion/barrier layer comprises titanium.

14. The method according to claim 12, wherein said electroplating said second metal layer comprises electroplating a copper layer directly on said first metal layer exposed by said opening in said first photoresist layer.

15. The method according to claim 12, wherein said forming said gold layer comprises an electroplating process.

16. The method according to claim 12, wherein said passivation layer further comprises an oxide layer under said nitride layer.

17. The method according to claim 12, wherein said removing said first photoresist layer is followed by said depositing said second photoresist layer.

18. The method according to claim 12, wherein said sputtering said first metal layer comprises sputtering a copper layer over said adhesion/barrier layer.

19. The method according to claim 12, wherein said gold layer has a thickness greater than 5 micrometers.

20. The method according to claim 12, after said depositing said second photoresist layer, further comprising forming a nickel layer over said second metal layer under said opening in said second photoresist layer, followed by said forming said gold layer over said nickel layer.

* * * * *